United States Patent
Dent

(10) Patent No.: US 7,511,640 B2
(45) Date of Patent: Mar. 31, 2009

(54) DIGITAL COMPRESSION OF BINARY DATA BLOCKS

(75) Inventor: Paul W. Dent, Pittsboro, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/669,252

(22) Filed: Jan. 31, 2007

(65) Prior Publication Data

US 2008/0180286 A1    Jul. 31, 2008

(51) Int. Cl.
*H03M 7/00* (2006.01)

(52) U.S. Cl. .............................. 341/60; 341/51; 341/52; 341/55; 341/65; 341/67

(58) Field of Classification Search .................. 341/52, 341/55, 56, 57, 60, 94, 102, 103
See application file for complete search history.

(56) References Cited

U.S. PATENT DOCUMENTS

| | | | | |
|---|---|---|---|---|
| 3,717,851 | A | * | 2/1973 | Cocke et al. ................. 711/220 |
| 5,537,551 | A | * | 7/1996 | Denenberg et al. .......... 709/247 |
| 5,627,534 | A | * | 5/1997 | Craft ........................... 341/87 |
| 5,703,907 | A | | 12/1997 | James |
| 5,798,718 | A | | 8/1998 | Hadady |
| 6,157,327 | A | * | 12/2000 | Akaogi ........................ 341/67 |
| 6,160,500 | A | * | 12/2000 | Demeure ..................... 341/50 |
| 6,216,213 | B1 | * | 4/2001 | Breternitz et al. ........... 711/170 |
| 6,343,354 | B1 | * | 1/2002 | Breternitz et al. ........... 711/201 |

(Continued)

OTHER PUBLICATIONS

Jaehyuk Im et al, "Lossless Compression of Bi-Level Images Based on Context Selection and Hierarchical Enumerative Coding", vol. 3, International Conference on Image Processing Proceedings, 2001, pp. 438-441.

(Continued)

*Primary Examiner*—Linh V Nguyen
(74) *Attorney, Agent, or Firm*—Nixon & Vanderhye, P.C.

(57) ABSTRACT

Method and apparatus are configured to assign a code of less than N number of bits in length to a pattern of bits of a first polarity value distributed within a block of N binary bits. The method basically comprises (1) determining a number of bits of the first value in the block of N binary bits; (2) selecting a base value based on the determined number of bits of the first value; (3) determining a displacement value representative of a particular distribution of the determined number of bits of the first value in the block of N binary bits; and (4) adding the base value and the displacement value to obtain a sum and using the sum to form an assigned code. The base value is preferably selected by evaluating an Expression $Io = {}^NC_1 + {}^NC_2 + {}^NC_3 \ldots + {}^NC_{K-1}$, wherein K is the determined number of bits of the first value in the block of N binary bits. Determining the displacement value preferably comprises (if bit N is a binary first value bit), recursively determining the displacement value $I(N,K)$ as ${}^{N-1}C_K + I(N-1,K-1)$, where $I(N-1,K-1)$ is the encoding of the pattern of K−1 number of remaining first value bits in N−1 bits. On the other hand, if bit N is not a first value bit, determining the displacement value preferably comprises recursively determining the displacement value $I(N,K)$ as $I(N-1,K)$ where K is the encoding of the pattern of K number of first value bits in the remaining N−1 number of bits.

23 Claims, 9 Drawing Sheets

U.S. PATENT DOCUMENTS

| | | | |
|---|---|---|---|
| 6,366,705 B1 * | 4/2002 | Chiu et al. | 382/239 |
| 6,484,228 B2 * | 11/2002 | Breternitz et al. | 711/1 |
| 6,539,470 B1 * | 3/2003 | Mahurin et al. | 712/208 |
| 6,922,432 B2 * | 7/2005 | Callaway et al. | 375/141 |
| 2002/0042862 A1 * | 4/2002 | Breternitz et al. | 711/125 |

OTHER PUBLICATIONS

International Search Report and Written Opinion mailed Jul. 11, 2008 in corresponding PCT Application No. PCT/SE2008/050021.

\* cited by examiner

DIGITAL COMPRESSION OF BINARY DATA BLOCKS

BACKGROUND

I. Technical Field

This application pertains to the compression or encoding of blocks of digital data, and particularly to the compression or encoding of blocks comprising particular distributions of binary values.

II. Related Art and Other Considerations

It is common in packet data transmission to send an acknowledgement of correct receipt of packets back to a transmitter which generated the packets, so that the transmitter may retransmit any packets that were not received correctly. Sometimes, due (for example) to transmission delay, especially through a satellite in orbit, it is not efficient to perform packet-by-packet acknowledgement. Instead, a receiver such as a packet data receiver receives groups of N number of data packets (referred to as "containers") from an originating transmitter. Using error detection, the receiver classifies each decoded data packet as correct or incorrect. If a packet is correct, the corresponding bit of an N-bit acknowledgement word is set to a first value (e.g., 0), while if the packet is incorrect, the bit is set to a second value (e.g., 1). The receiver then causes an associated transmitter to transmit a coded message to a receiver associated with the originating transmitter in a manner to include or allow reconstruction of the acknowledgement word, and thus to inform the originating transmitter which packets must be resent.

In the prior art, two general method are known for transmitting such acknowledgement words. A first method transmits the entire acknowledgment word, adding a Cyclic Redundancy Check (CRC) code to guard against errors. A second known method employs run-length encoding to compress the acknowledgement word. Run length encoding exploits the expectation that the pattern of errors will be clumped, so that runs of several zeros are expected to be interspersed with runs of several ones. This is indeed the error pattern that would be expected due to a slowly Rayleigh fading signal, as may occur in terrestrial mobile communications. However, in satellite communications operating at marginal signal levels and in a Rician fading environment, the pattern of errors can be different. Errors do not necessarily occur in runs, but rather are randomly distributed.

Nevertheless, if the number of errors is less than some threshold, the number of possible error patterns can be described using less than N-bits, thus allowing greater sized containers to be acknowledged using the same message length.

What is desired, therefore, and an object of the present invention, are one or more of method, apparatus, system, and technique for assigning numbers of less than N bits to particular patterns of K polarity values in N bits, in such a way that the numbers may be easily decoded to reproduce an N-bit word.

BRIEF SUMMARY

Method and apparatus are configured to assign a code of less than N number of bits in length to a pattern of bits of a first polarity value distributed within a block of N binary bits. The method basically comprises (1) determining a number of bits of the first value in the block of N binary bits; (2) selecting a base value based on the determined number of bits of the first value; (3) determining a displacement value representative of a particular distribution of the determined number of bits of the first value in the block of N binary bits; and (4) adding the base value and the displacement value to obtain a sum and using the sum to form an assigned code.

The base value is preferably selected by evaluating an Expression $Io = {}^N C_1 + {}^N C_2 + {}^N C_3 \ldots + {}^N C_{K-1}$, wherein K is the determined number of bits of the first value in the block of N binary bits.

Determining the displacement value preferably comprises (if bit N is a binary first value bit), recursively determining the displacement value $I(N,K)$ as ${}^{N-1}C_K + I(N-1, K-1)$, where $I(N-1, K-1)$ is the encoding of the pattern of K-1 number of remaining first value bits in N-1 bits. On the other hand, if bit N is not a first value bit, determining the displacement value preferably comprises recursively determining the displacement value $I(N,K)$ as $I(N-1,K)$ where K is the encoding of the pattern of K number of first value bits in the remaining N-1 number of bits.

In some example embodiments and modes, if it is determined that the assigned code is greater than a maximum allowed value, the assigned code is set to the maximum allowed value as an indication of the encoding failure.

Some example embodiments and modes are configured with logic or apparatus for selecting either an encoding/compression technique such as those described herein or encompassed hereby, or another encoding/compression technique (such as run length coding, for example), or another way of communicating regarding content of a block of data, for example. For example, an encoder technique selector may be employed and configured to employ plural possible encoding or compression techniques in a predefined order. Based on predetermined order and achieved success, an encoding technique selection indicator can optionally be included in a message or acknowledgement word to apprise a receiver or decoder as to which of the plural possible encoding techniques was actually utilized.

The encoder technique selector/selection may also comprise logic or functionality for determining or assessing conditions or situations which are particularly ripe or appropriate for use of one type of encoding/compression technique rather than another. For example, an example embodiment of an encoder technique selector analyzes a block and determines whether error bits, e.g., bits of a first polarity, are all located in one of a number of particular subsets of said N-bits. If the error bits (e.g., the first polarity bits) in the N-bit block are all located in a particular subset of said N-bits, the encoder uses as the assigned code the error-detected subset of bits appended to an indicator, the indicator serving to indicate which subset was used and that a subset was, in fact, used as opposed to another encoding technique.

A non-limiting, example context for illustration and explanation of the embodiments described herein or encompassed hereby is that of encoding/compression of an acknowledgement message or word, with bits of the message/word corresponding to packets of a block, the bits indicating whether an event (e.g., an error) occurs in/for the packet or not.

Whereas in some of its aspects the technology encompasses various example embodiments of encoders and modes of operation thereof, in other aspects the technology encompasses decoders and method of operating decoders, as well (in other example embodiment and modes) as communication systems which employ both encoders and decoders.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled or described as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 1:
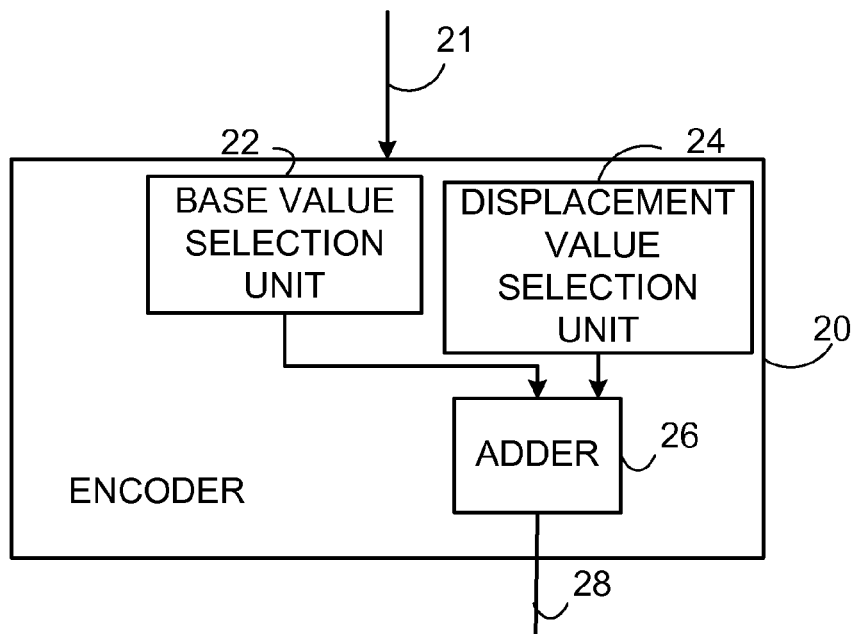
FIG. 1 is a schematic view of a first example embodiment of an encoder.

FIG. 1 illustrates an example embodiment of an encoder 20 which receives (as represented by arrow 21) an N-bit word. The encoder 20 is configured to encode the N-bit word into fewer than N-bits when the frequency of occurrence of a particular type of bit polarity (e.g., a first value bit, or first polarity value, such as a binary 1), is limited to some fraction of N, e.g., E/N. The example encoder 20 of FIG. 1 comprises a base selection unit 22; a displacement value determination unit 24; and an adder 26. As hereinafter explained in greater detail, base selection unit 22 is configured to select a base value dependent on a number of bits of the first value (e.g., first polarity) in the block of N binary bits. The displacement value determination unit 24 is configured to determine a displacement value representative of a particular distribution of the number of bits of the first value in the block of N binary bits. The adder 26 is configured to add the base value and the displacement value to obtain a sum. The sum can be used to obtain, and preferably is, the code (e.g., the fewer than N-bit encoded value) output by encoder 20, e.g., the code assigned by encoder 20 as the "assigned code", as indicated by arrow 28.

Figure 2:
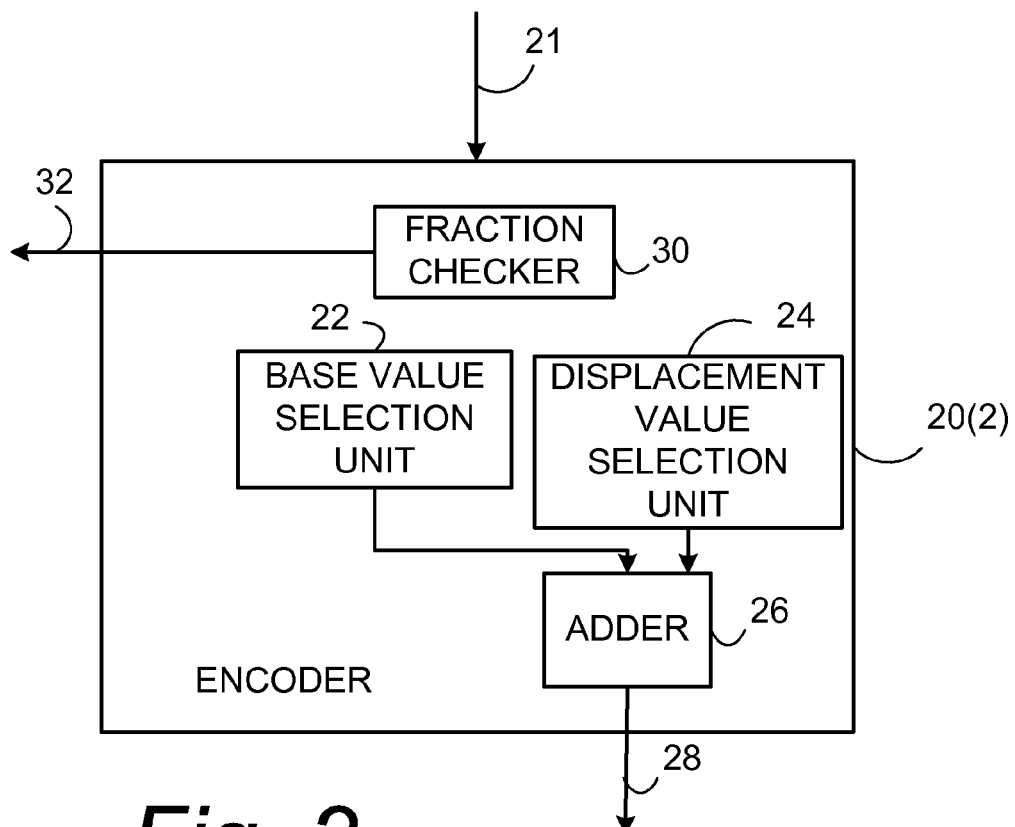
FIG. 2 is a schematic view of a second example embodiment of an encoder.

FIG. 2 illustrates an example variation wherein encoder 20(2) further optionally includes a fraction checker unit 30. In particular, fraction checker unit 30 is configured to determine if the number of first value bits (e.g., binary 1s) is greater than the acceptable fraction E/N. If fraction checker unit 30 determines that the number of first value bits is greater than the acceptable fraction E/N, as shown by arrow 32 the fraction checker unit 30 can generate and/or send a message or code indicating that the number of first value bits was more than could be encoded.

Figure 3:
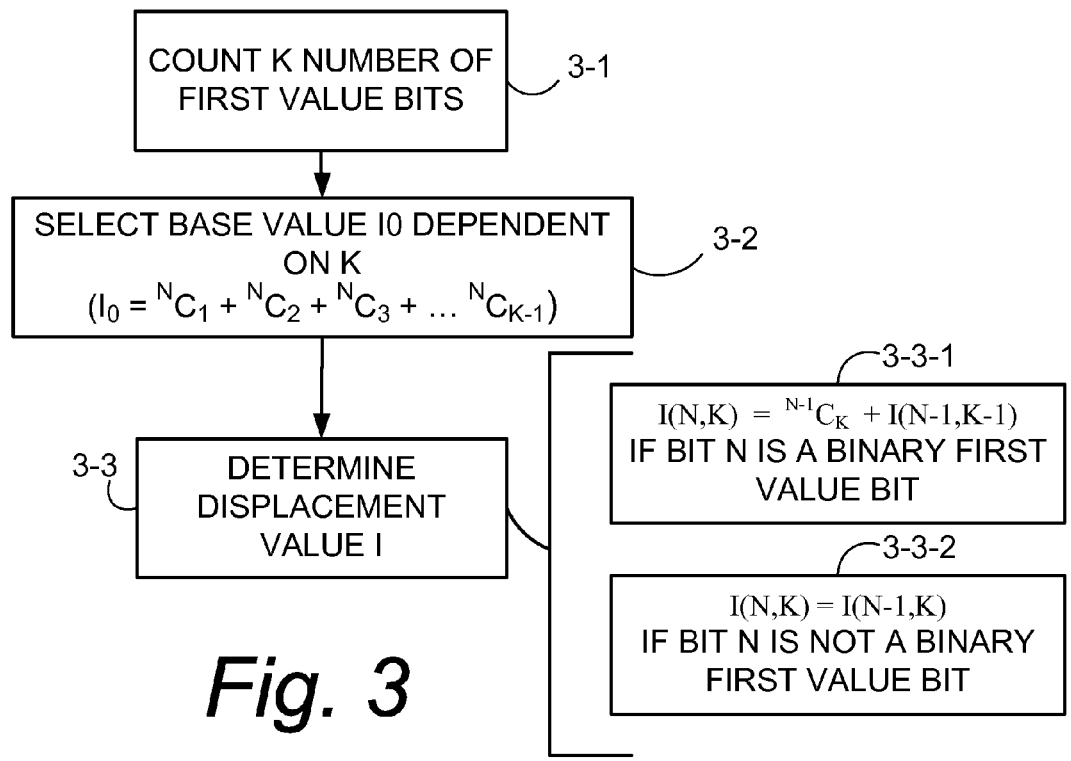
FIG. 3 is a flow chart showing example, non-limiting, representative acts performed in conjunction with an example mode of an encoding process.

FIG. 3 shows example, non-limiting, representative acts performed by an encoder (such as encoder 20 or other encoders described herein). Act 3-1 depicts counting of the number K of first value bits (e.g., first polarity bits such as binary one bits) in the N bit word input to encoder 20. Act 3-2 depicts determining or selecting a base value $I_0$ dependent on the number K of bits of the first value in the block of N binary bits. Act 3-3 depicts determining a displacement value I.

Act 3-2 is now described in more detail, and is initially described with reference to several examples before developing a generic representation. If K is 1, the number of possible patterns of first value bits (e.g., binary one [1]) in N bits is N. Accordingly, the encoding is a number between 1 and N. Incidentally, the number zero is used to indicate there are no first value bits (e.g., no digital 1s) in the N bit input word.

If K is 2, the number of possible bit patterns is $^{N}C_{2}$, so the particular pattern of exactly two first value bits may be described by a number between 1 and $^{N}C_{2}$. To ensure that the code used to describe a pattern of two first value bits does not overlap the codes used to describe a pattern of one first value bit, the code that can be used for the number is displaced beyond the highest code used for one by adding N. Thus, the code for a pattern of two errors is thus between N+1 and N+$^{N}C_{2}$. Likewise, the code used to describe a pattern of exactly three first value bits in a word of N bits will be between N+$^{N}C_{2}$+1 and N+$^{N}C_{2}$+$^{N}C_{3}$.

In general, therefore, the code used to describe a pattern of exactly K number of first value bits will be between $^{N}C_{1}$+$^{N}C_{2}$+$^{N}C_{3}$ ... +$^{N}C_{K-1}$+1 and $^{N}C_{1}$+$^{N}C_{2}$+$^{N}C_{3}$ ... +$^{N}C_{K}$. $^{N}C_{K}$ is a standard mathematical notation for the number of possible ways to choose K things from a total of N and comes from the theory of permutations and combinations. Thus the number of binary words of N bits that have any K bits equal to the first value bit (e.g., "1") is simply the number of possible ways of selecting those K bits out of the total N. The value of $^{N}C_{K}$ can be written as in Expression 1 [wherein Factorial N is divided by factorial K and factorial (N−K)] or Expression 2 (in both Expression 1 and Expression 2 and as used herein, N and K are both non-negative integers). For example, $^{5}C_{2}$ is (5×4×3)/(2×1)=30.

$$^{N}C_{K}=N!/[(N-K)!K!] \quad \text{Expression 1}$$

$$^{N}C_{K}=N(N-1)(N-2)\ldots(N-K+1)/K(K-1)(K-2)\ldots 1 \quad \text{Expression 2}$$

The encoded result, or output code, may be written as Base+Displacement, or $I_{O}$+I, where the base $I_{O}$=$^{N}C_{1}$+$^{N}C_{2}$+$^{N}C_{3}$ ... +$^{N}C_{K-1}$ and a value known as the displacement (I) is in a range of 1 to $^{N}C_{K}$. Thus, as act 3-2, the base value $I_{0}$ is selected as $I_{O}$=$^{N}C_{1}$+$^{N}C_{2}$+$^{N}C_{3}$ ... +$^{N}C_{K-1}$.

Act 3-3 of the encoding mode of FIG. 3 involves determining the displacement value I, as mentioned above. Specifically, the displacement value (I) is computed or determined according to two cases. As a first case, if bit N of the N-bit input word has a value other than the first value bit (e.g., bit N is a binary 0 in the case wherein the first value bit is a binary 1), then the K number of first value bits (e.g., binary 1s) must be contained in bits 1 to N−1. There are, therefore, $^{N-1}C_{K}$ number possible patterns of K number of first value bits (1) in the N−1 remaining bits of the N-bit input word. On the other hand, as a second case, if bit N of the input word is of the first value (e.g., a binary 1), then K−1 number of first value bites are contained in the N−1 remaining bits. Thus, in this second case, there are $^{N-1}C_{K-1}$ possible patterns of K−1 first value bits in N−1 number of bits.

Expression 3 thus provides a mathematical identity:

$$^{N}C_{K}=^{N-1}C_{K}+^{N-1}C_{K-1} \quad \text{Expression 3}$$

The mathematical identity of Expression 3 can be used to define an order in which numbers I in increasing order are assigned to particular patterns of exactly K number of first value bits in N bits.

Denoting by I(N,K) the index of the pattern of K number of first value bits in N bits being encoded, I may be recursively computed in the manner described below.

As shown by sub-act 3-3-1 of FIG. 3, if bit N is a binary first value bit (e.g., a binary 1), I(N,K) is given by I(N,K)=$^{N-1}C_{K}$+I(N−1,K−1) where I(N−1,K−1) is the encoding of the pattern of K−1 number of remaining first value bits in N−1 bits.

On the other hand, as shown by sub-act 3-2 of FIG. 3, if bit N is not a first value bit (e.g., if bit N is a binary zero), then I(N,K)=I(N−1,K) where K is the encoding of the pattern of K number of first value bits in the remaining N−1 number of bits.

Figure 4:
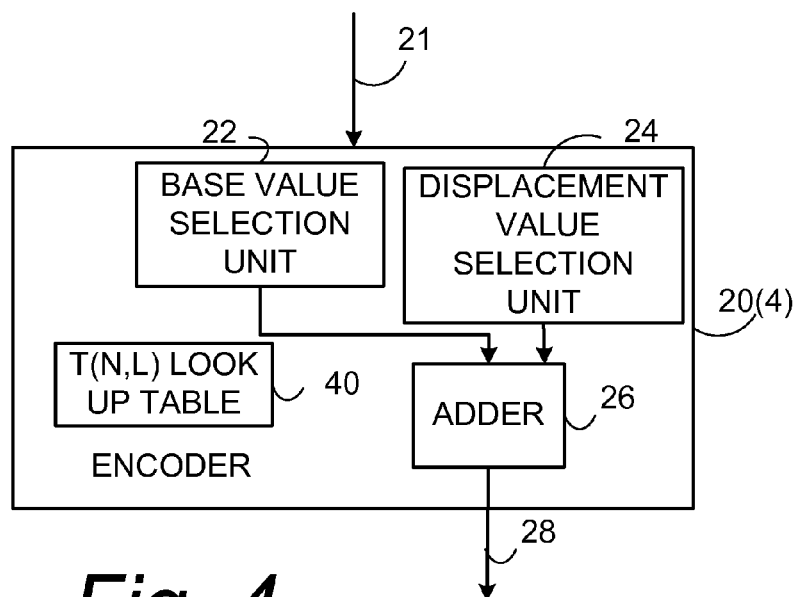
FIG. 4 is a schematic view of a third example embodiment of an encoder.

In accordance with an example implementation, the values of $^{N}C_{K}$ needed in the above method acts may be pre-computed and stored in a look up table T(N,K) for all values of N and K to avoid real time computation. FIG. 4 thus illustrates an example embodiment wherein encoder 20(4) comprises T(N, K) look up table 40.

Figure 5:
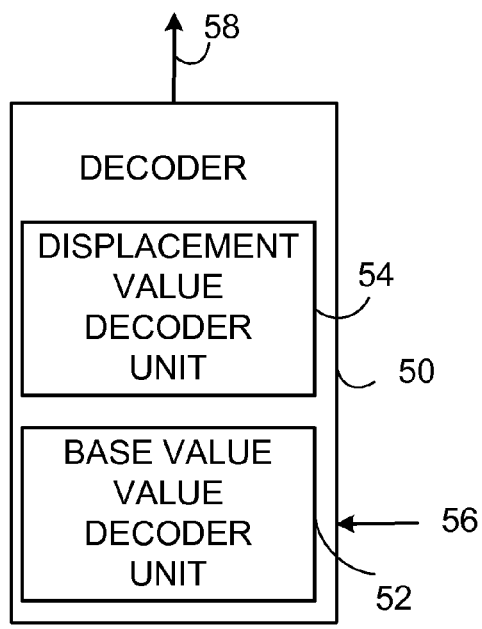
FIG. 5 is a schematic view of a first example embodiment of a decoder.

Another aspect of the technology, as illustrated by way of example in FIG. 5, concerns a decoder 50 which is configured to decode a code which is received from an encoder such as encoder 20 or another described in accordance with or encompassed by the foregoing. The decoder 50 is preconfigured with or otherwise communicated the values for N and K. The decoder 50 comprises base value decode unit 52; a displacement value decode unit 54. The decoder 50 receives a code (as indicated by arrow 56) and outputs a decoded word (as indicated by arrow 58).

Figure 6:
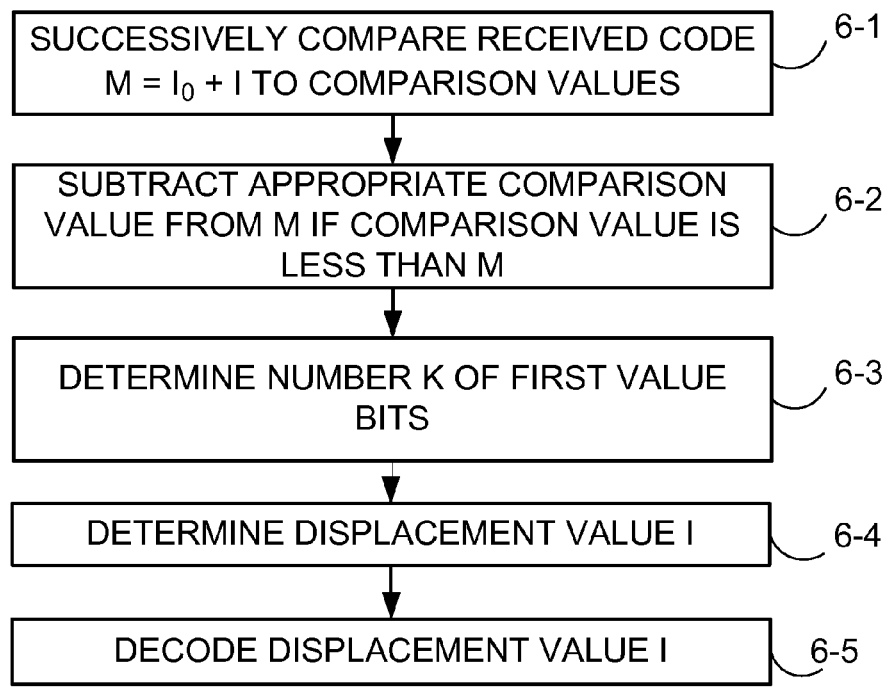
FIG. 6 is a flow chart showing example, non-limiting, representative acts performed in conjunction with an example mode of a decoding process.

Example, representative, non-limiting, acts performed by a decoder such as decoder 50 are depicted in FIG. 6. In the example mode of FIG. 6, act 6-1 comprises successively comparing the received code M=Io+I to the comparison values, $^{N}C_{1}$, $^{N}C_{2}$ ... $^{N}C_{Kmax}$. Act 6-2 comprises subtracting an appropriate, selected comparison value from M if the selected comparison value is less than M. When M is less than the comparison value $^{N}C_{K}$, as act 6-3 the suffix K yields the number of first value bits in the N-bit word to be reconstructed, and as act 6-4 the residual value of M equals displacement value (I), the code assigned to that particular pattern of exactly K number of first value bits (e.g., binary 1s). As act 6-5, the displacement value (I) is then decoded to determine the corresponding pattern by comparing I to $^{N-1}C_{K}$. If displacement value (I) it is less or equal to $^{N-1}C_{K}$, then bit(N) is not a first value bit, else bit(N) is a first value bit. If bit(N) does have the first value, the comparison value is then subtracted and the procedure then compares the remainder with $^{N-2}C_{K-1}$ to determine bit(N−1). If however bit(N) is not the first value bit, then the next comparison is with $^{N-1}C_{K-1}$ and so forth. The procedure recurs until all bits of the N-bit pattern have been recreated.

TABLE 1 is an example test program showing an example implementation of logic or a routine that invokes or calls an example ENCODING FUNCTION and an example DECODING FUNCTION for an input word of N bits, wherein N ranges up to twenty four bits. Twenty-four bits is within the thirty two-bit maximum length of standard integer words. Using machines with instructions that operate on longer word lengths, or software programs that implement longer word length arithmetic, any length word may be encoded by a suitable modification of these routines that may be made by a person of normal skill using the information disclosed herein.

TABLE 2 shows an example implementation of logic or a routine for a RECURSIVE INTEGER FUNCTION which performs the inventive compression algorithm, and TABLE 3 shows an example implementation of logic or a routine for the example DECODING FUNCTION. By way of the example implementation, the logic and routines of TABLE 1-TABLE 3 are coded in FORTRAN. It will be appreciated that other types of coding and logic and/or routines can alternatively be provided.

Yet other example embodiments and modes include selecting (e.g., dynamically selecting) between either (1) encoding/compression techniques such as those encompassed by the foregoing or (2) other encoding/compression techniques (e.g., a standard run-length encoding algorithm) to compress the pattern of K number of first value bits in N bits. The technique which achieves the best compression is selected, or no technique is employed if none is efficacious. The dynamic selecting among encoding/compression techniques is particularly advantageous when all first value bits are located in a specific part of the word. A non-limiting, example context for illustration and explanation of the embodiments which include dynamic selection is that of an acknowledgement word, with bits of the word corresponding to packets of a block, the bits indicating whether the packet contains an error or not.

For example, suppose it is required to convey the information as to which of sixty four data packets were received in error, using fewer than sixty four bits. Reducing the number of bits can often be useful in order to accommodate the use of error correcting or error detecting codes, or both, both of which expand the number of bits.

Figure 7:
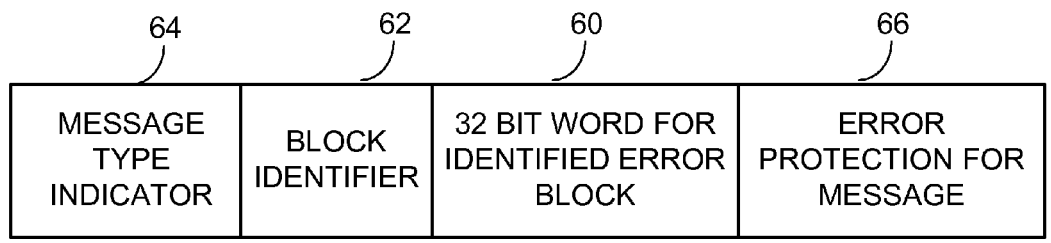
FIG. 7 is a diagrammatic view of a format of a first type message.

Several implementations of dynamic selection embodiments and modes are now described by way of representative examples, each implementation typically resulting in or utilizing a correspondingly different message type. For example, a first implementation of an encoding selection embodiment/mode can employ a first message type to describe all possible errors in blocks of thirty two packets, if the errors were confined to less than all thirty two-packet blocks. An example format of the first message type, generically depicted in FIG. 7, comprises a thirty two-bit word 60 for each block containing an error (e.g., each bit of word 60 corresponding to a packet of the block), a block identifier 62 for identifying the block containing the error(s), and a message indicator 64 (flag, bit, or value) attached to indicate that the message is, in fact, this first type of message. The thirty two-bit word 60 plus the block indicator plus message indicator is preferably error-protected (as by, e.g., error protection code 66 or a cyclical redundancy check character, for example) and transmitted.

Figure 8:
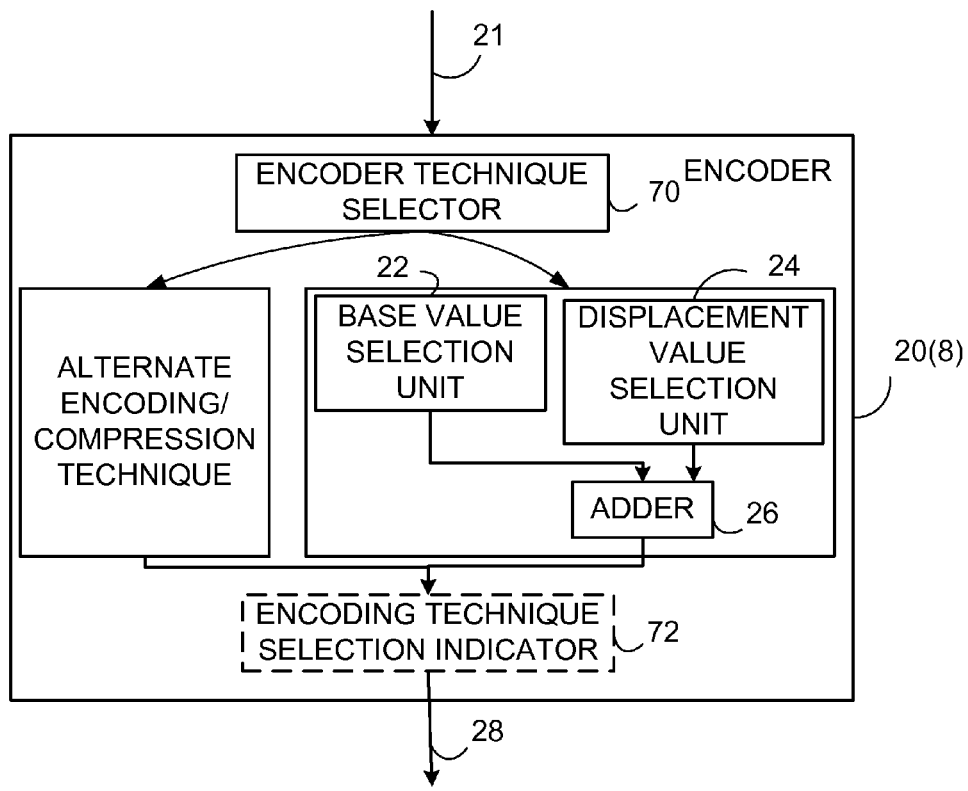
FIG. 8 is a schematic view of another example embodiment of an encoder.

FIG. 8 illustrates an example embodiment and mode wherein encoder 20(8) includes an encoder technique selector 70 and (optionally) an encoding technique selection indicator 72. The encoder technique selector 70 is configured with logic for selecting either an encoding/compression technique such as those described herein or encompassed hereby, or another encoding/compression technique (such as run length coding, for example), or another way of communicating regarding content of a block of data, for example.

Figure 9:
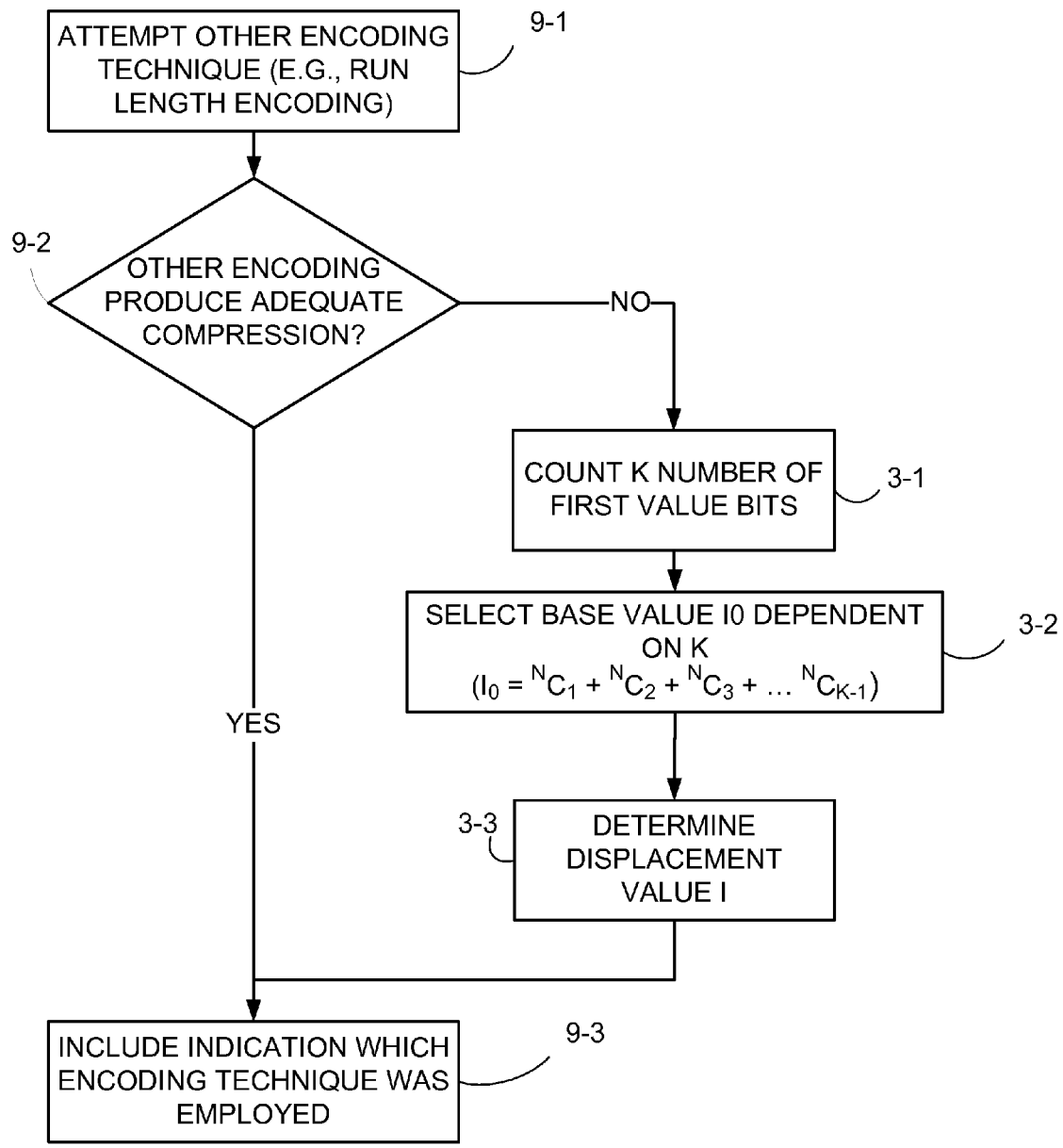
FIG. 9 is a flow chart showing example, non-limiting, representative acts performed in conjunction with an example mode of an encoding process having dynamic selection of encoding techniques.

The encoder technique selector 70 may be configured to employ plural possible encoding or compression techniques in a predefined order, whereby encoder 20(8) implements logic or representative acts such as those shown in FIG. 9, for example. In the particular example shown in FIG. 9, as act 9-1 the encoder technique selector 70 essentially initially automatically selects and employs a default encoding technique or scheme such as run length coding for encoding a N bit word. As act 9-2 a check is performed whether the encoding of act 9-1 produced or yielded an adequate compression of the N-bit word. If the encoding of act 9-1 (e.g., run length encoding) did provide sufficient compression, an indication is attached to the resultant assigned code that the "other" encoding technique (e.g., run length encoding) was employed. On the other hand, if the encoding of act 9-1 failed to produce an adequate compression of the N-bit word (if using the default coding (such as run-length encoding) does not produce an encoded block of bits shorter than a desired length), encoding such as that herein described (e.g., by the acts of FIG. 3) is next employed. Thus, the encoder can dynamically select the appropriate encoding technique based on predetermined order and achieved success, and (where appropriate) the encoding technique selection indicator 72 can include (as at step 9-3) an indication or other information which will apprise a receiver or decoder as to which of the plural possible encoding techniques was actually utilized for the word.

Figure 10:
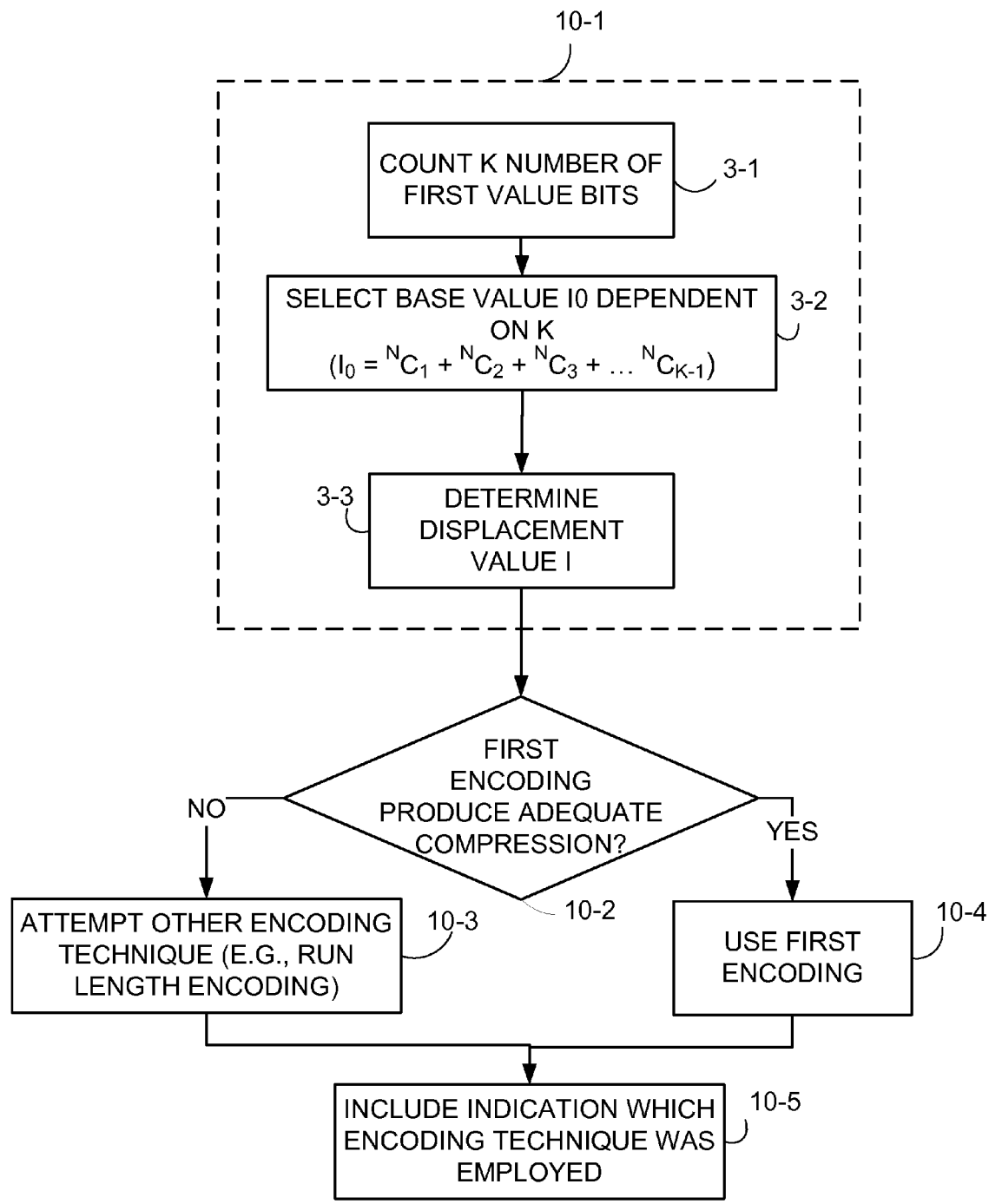
FIG. 10 is a flow chart showing example, non-limiting, representative acts performed in conjunction with another example mode of an encoding process having dynamic selection of encoding techniques.

FIG. 10 illustrates another variation in which the order of encoding technique invocation is opposite that of FIG. 9. In FIG. 10, as represented by act 10-1 the encoder technique selector 70 first attempts a (first) encoding technique such as that of FIG. 3. If it is determined at act 10-2 that the first encoding technique fails to produce adequate compression, then (as act 10-3) another encoding technique is employed. If it is determined at act 10-2 that the first encoding technique does produce adequate compression, then (as act 10-4) the encoding generated by the first encoding technique is used as the assigned code. As act 10-5 an indicator can be appended which can be used by a receiver or decoder to discriminate as to which encoding technique was actually employed.

As a variation of the foregoing, the encoder technique selector 70 may include logic or functionality for determining or assessing conditions or situations which are particularly ripe or appropriate for use of one type of encoding/compression technique rather than another. For example, the encoder technique selector 70 can be employed in a second implementation of an encoding selection embodiment/mode and can employ a second message type in a situation such as all blocks of thirty two-packets containing errors. The thirty two-bit blocks are assembled into a larger block, such as sixty four bits, and then run-length encoded (as at act 9-1). If run-length encoding produces an adequate compression (as determined by act 9-2), then the compressed word is appended to an indicator (act 9-3) for this second message type, and (optionally) error protected and then transmitted.

On the other hand, if run-length encoding does not produce adequate compression, then the techniques described herein and encompassed hereby (with acts such as those of FIG. 3) may be applied. The result is a code of fifty bits or less for N=64 and Kmax=16, but may be less than fifty bits with more errors if they are confined to a particular part of the sixty four-bit word. If the result is of length greater than can be described in fifty bits, actually greater than $2^{50}-2$, the code is set to $2^{50}-1$, (fifty 1's) indicating that the error pattern could not be encoded. This is taken by the transmitter to indicate that all sixty four packets need to be retransmitted. The fifty-bit code together with an indicator of message type 3 is then error protected and transmitted.

Figure 11:
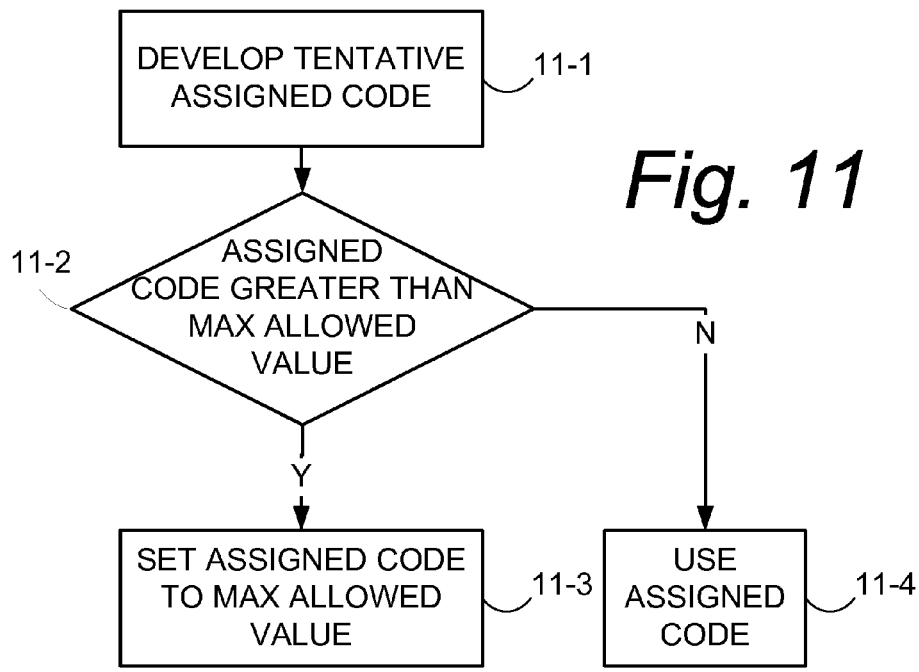
FIG. 11 is a flow chart showing example, non-limiting, representative acts which can be preformed when an assigned code is determined to be greater than a maximum allowed value.

The foregoing together with FIG. 11 further illustrates that once a tentative assigned code is developed (act 11-1), and if the assigned code is determined (as act 11-2) to be greater than a maximum allowed value, then as act 11-3 the assigned code can be set to the maximum allowed value to indicate the encoding failure. The assigned code is used if it is not greater than the maximum value (act 11-4).

Figure 12:
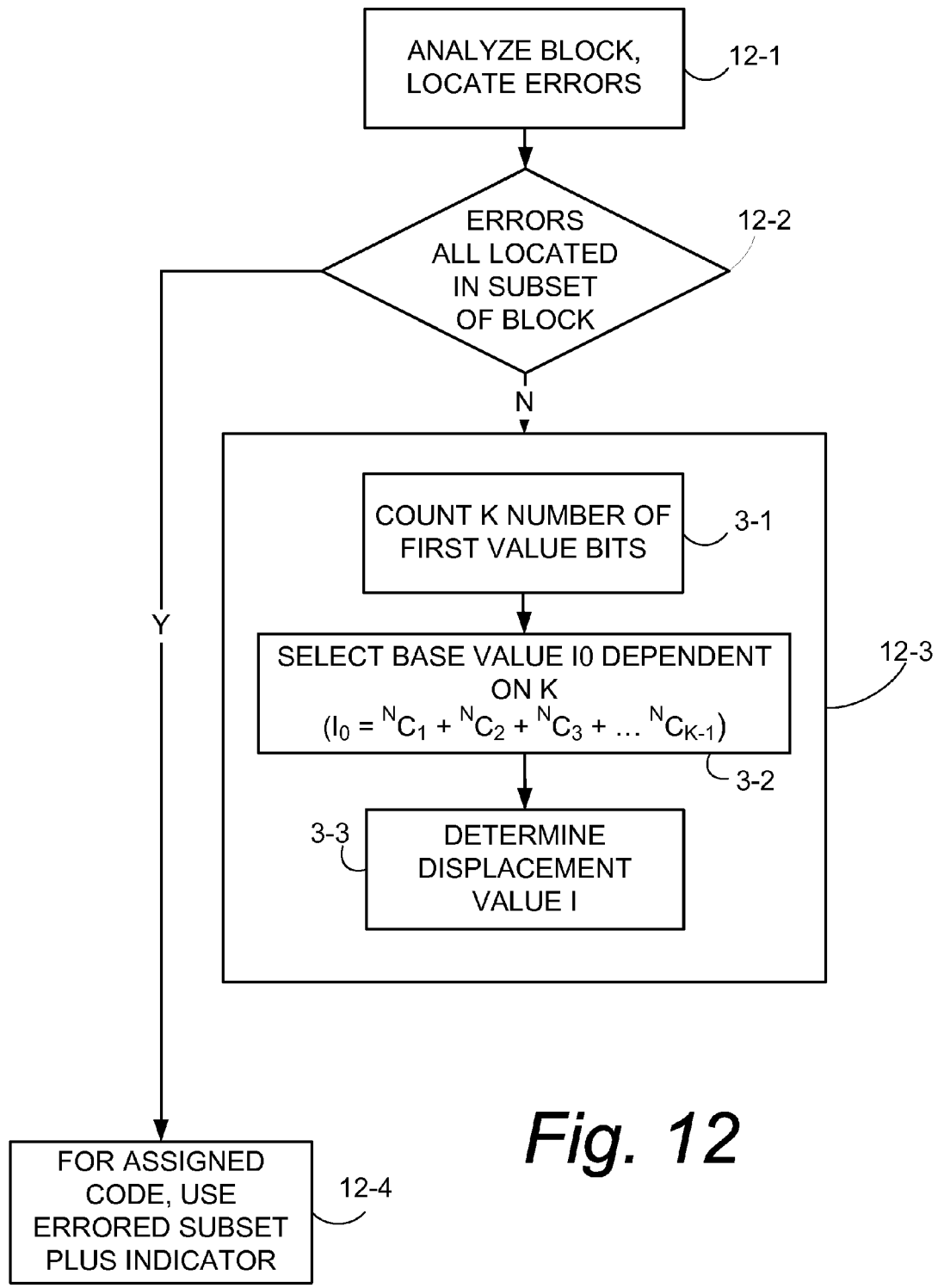
FIG. 12 is a flow chart showing example, non-limiting, representative acts performed in conjunction with another example mode of an encoding process having dynamic selection of encoding techniques.

The encoder technique selector 70 may have logic for analyzing a block and for determining what type of communication(s) is/are to be provided regarding content of the block. For example, in an implementation wherein the encoder performs the action of encoding an acknowledgement word representing a received block, the encoder technique selector 70 comprises logic for executing actions such as those illustrated in FIG. 12. According to act 12-1, the encoder technique selector 70 analyzes the block and determines (as act 12-2) whether error bits, e.g., bits of a first polarity in said N-bit blocks, are all located in one of a number of particular subsets of said N-bits.

Figure 13:
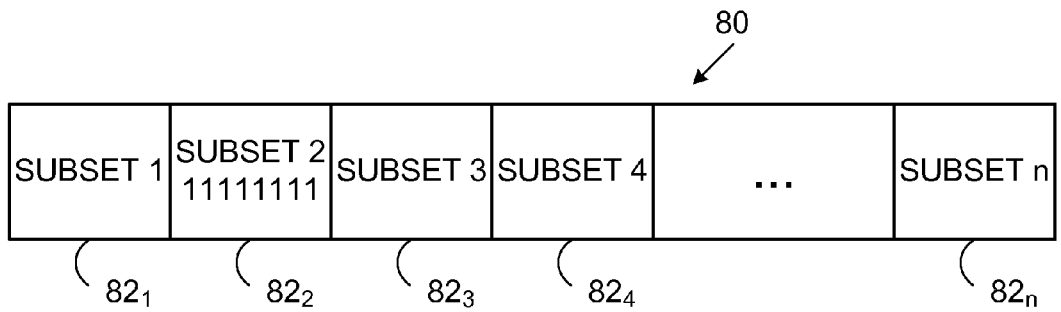
FIG. 13 is a diagrammatic view of an example embodiment block having first polarity bits essentially confined to a block subset.

For example, FIG. 13 illustrates a block 80 wherein errors occur in one general area or subset of block 80. The encoder technique selector 70 divides block 80 into subsets $82_1$, $82_2$, ... $82_n$, and observes that all errors (e.g., all first polarity bits) occur in one particular subset, i.e., subset $82_2$. The definition or delineation of a "subset" (e.g., subset length and/or location) can be predefined/predetermined or determined, e.g., by encoder technique selector 70, on the fly.

Figure 14:
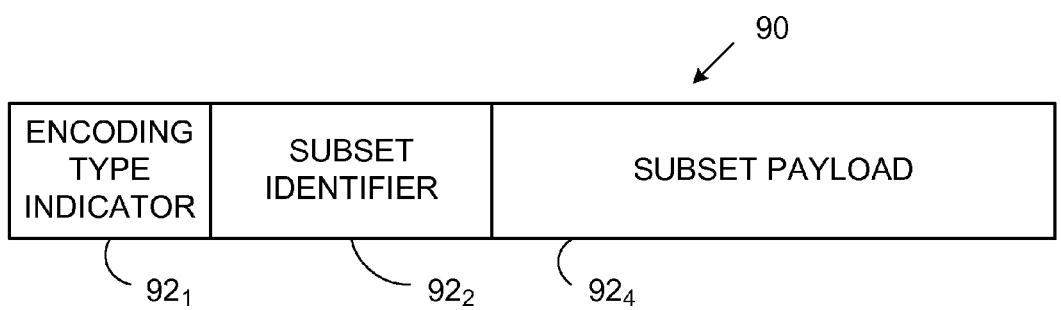
FIG. 14 is a diagrammatic view of an example message or word suitable for use with the mode of FIG. 12.

If it is determined at act 12-2 that the errors were not all located in the particular subset of block 80, as depicted by act 12-3 the encoder technique selector 70 selects a default encoding/compression technique such as that of FIG. 3 On the other hand, as illustrated by act 12-4, if the error bits (e.g., the first polarity bits) in the N-bit blocks are all located in a particular subset of said N-bits, the encoder uses as the assigned code the subset of bits appended to an indicator, the indicator serving to indicate which subset was used and that a subset was, in fact, used. For example, FIG. 14 illustrates an example format of a message 90 or encoded word comprising an encoder type flag or indicator $92_1$, a subset identifier $92_2$; and a payload $92_4$. The encoder type flag or indicator $92_1$ specifies that an encoding technique such as that of act 12-4 was performed (in lieu of, for example, a default encoding technique). The subset identifier $92_2$ identifies the errored subset of the block, e.g., subset $82_2$ in the illustrated example). The payload $92_4$ includes the contents of the errored subset.

Figure 15:
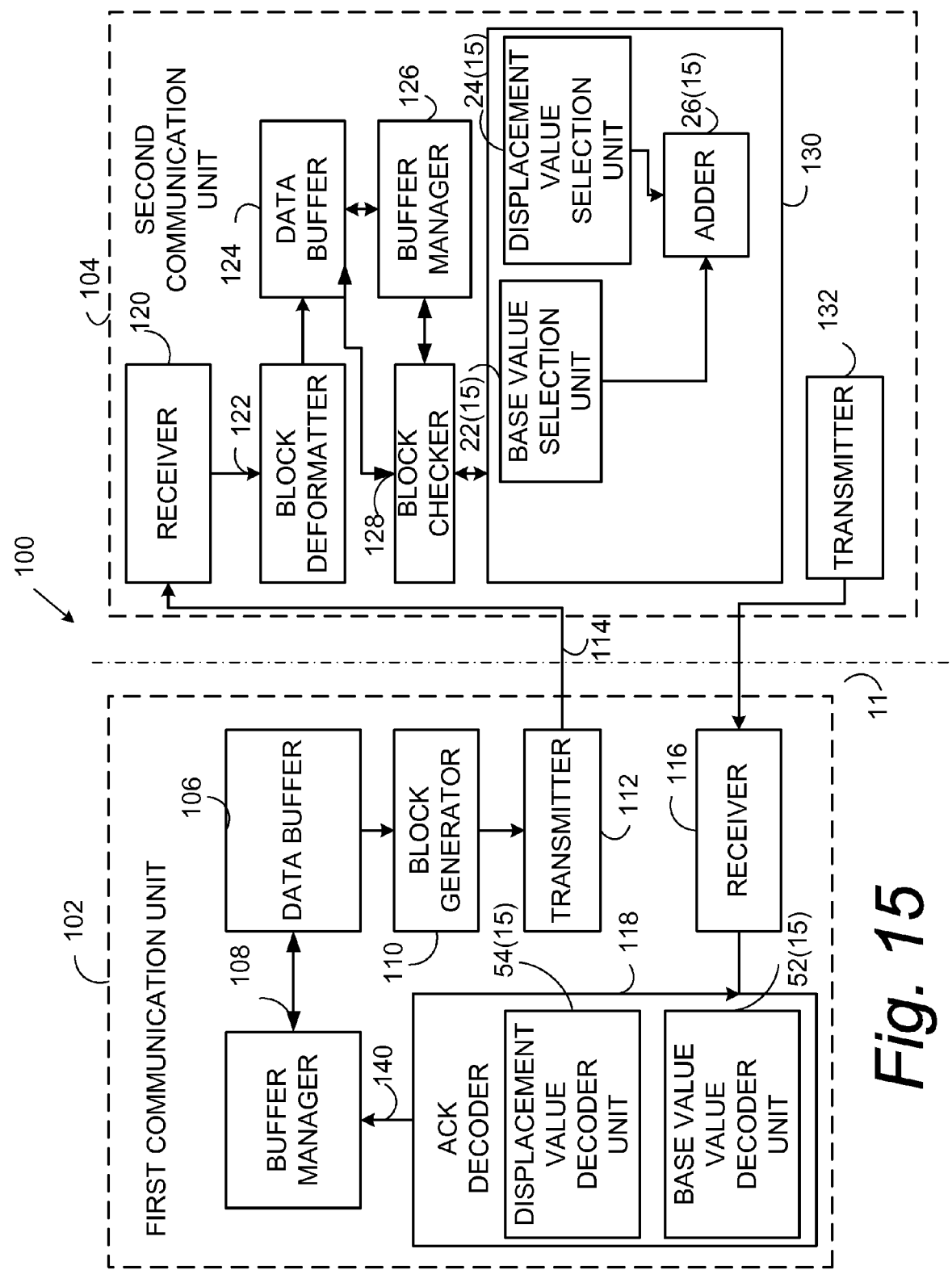
FIG. 15 is a schematic view showing an example embodiment of a communication system comprising first communication unit and second communication unit.

In general, a non-limiting, example context for illustration and explanation of the embodiments described herein or encompassed hereby is that of an acknowledgement message or word, with bits of the message/word corresponding to packets of a block, the bits indicating whether an event (e.g., an error) occurs in/for the packet or not. To this end, FIG. 15 shows an example embodiment of a communication system 100 comprising first communication unit 102 and second communication unit 104. The first communication unit 102 comprises a data buffer 106 configured to receive and store information to be transmitted, e.g., from first communication unit 102 to second communication unit 104. Reception, storage, and read out of the data in data buffer 106 is supervised and controlled by buffer manager 108. Either data buffer 106 or a separate block generator 110 format the data stored in data buffer 106 into block form. The parameters and requirements of the block format can vary according to implementation. The blocks are eventually supplied to a transmitter 112 (e.g., a transmitter part of a transceiver for first communication unit 102) for application/transmission over an outgoing channel 114.

As explained subsequently, first communication unit 102 also comprises a receiver 116 (e.g., a receiver part of a transceiver for first communication unit 102) and a decoder, such as acknowledgement decoder 118.

The second communication unit 104 of FIG. 15 comprises a receiver 120 (e.g., a receiver part of a transceiver for second communication unit 104). The receiver 120 is connected to a block deformatter 122 which divides or delineates the data received from first communication unit 102 over channel 114 into blocks. The blocks which are deformatted by block deformatter 122 are stored in data buffer 124. Like data buffer 106, the reception, storage, and read out of blocks stored in buffer 124 are supervised or controlled by buffer manager 126. Moreover, second communication unit 104 comprises a block checker 128 arranged to locate errors in a block received over outgoing channel 114 and stored in buffer 124. Error location can be performed by block checker 128 in accordance with any of many well known techniques. Additionally and optionally, block checker 128 can also attempt error correction using conventional error correction techniques.

In conjunction with its block checking, the block checker 128 (or a comparable unit) prepares an acknowledgement message or acknowledgement word which reflects the accuracy of a block received from first communication unit 102 over outgoing channel 114. For example, each packet of the block may be represented by a bit in the acknowledgement word, with the bit being set to a first polarity value (e.g., a binary one) if the packet contained an error, or a second polarity value (e.g., a binary zero) if the packet did not contain an error.

The second communication unit 104 further comprises an acknowledgement message encoder 130 and a transmitter 132 (e.g., a transmitter part of a transceiver for second communication unit 104). The acknowledgement message encoder 130 encodes or compresses the acknowledgement message or acknowledgement word developed, e.g. by block checker 128. The encoding or compression of the acknowledgement message or acknowledgement word as preformed by acknowledgement message encoder 130 can be in accordance with any of the encoding/compression techniques described herein or encompassed hereby. To this end, FIG. 15 shows, by way of non-limiting example, acknowledgement message encoder 130 as comprising a base selection unit 22(15); a displacement value determination unit 24(15); and an adder 26(15), operations of which are understood with reference to discussions of previous example embodiments such as, for example, FIG. 3. It will also be appreciated that the structure and operation of acknowledgement message encoder 130 may combine features and techniques from one or more of the foregoing example embodiments.

For the purposes now described, the acknowledgement message encoder 130 serves as an acknowledgement message transmitter. Specifically, the transmitter 132 transmits the encoded/compressed acknowledgement message or acknowledgement word over channel 134 to first communication unit 102.

The encoded/compressed acknowledgement message or acknowledgement word sent over channel 134 from second communication unit 104 to first communication unit 102 is received by receiver 116 of first communication unit 102. In view of the fact that the acknowledgement message or acknowledgement word sent over channel 134 has been encoded/compressed, the acknowledgement message or acknowledgement word is applied to acknowledgement decoder 118. The decoding or decompression of the acknowledgement message or acknowledgement word as preformed by acknowledgement decoder 118 can be in accordance with any of the techniques described herein or encompassed hereby. By way of example, FIG. 15 shows acknowledgement decoder 118 as comprising base value decode unit 52(15) and displacement value decode unit 54(15), in like manner as understood by FIG. 5. For example, a decoding operation as performed by acknowledgement decoder 118 can be that generically represented by FIG. 6.

When it is determined by acknowledgement decoder 118 that a packet of a block contained an error, acknowledgement decoder 118 sends a signal or message (as indicated by arrow 140) to buffer manager 108. The signal 140 to buffer manager 108 indicates which packet was in error, and thereby enables buffer manager 108 to again fetch the errored packet from data buffer 106 for use in preparing another block for transmission on outgoing channel 114 from first communication unit 102 to second communication unit 104. Retransmission of the packet in this manner provides the second communication unit 104 with another opportunity to receive and hopefully successfully retrieve the contents of the retransmitted packet.

The technology thus provides a means to compress a word of N binary bits to fewer than N bits, either when used alone or in instances when other methods or techniques fail. It can be combined with the other methods so that together, many different statistical distributions of bits within the N-bit word can be encoded, which are the likely distributions expected to be most prominent in a given application. Bit distributions that cannot be encoded by any of the repertoire of encoding methods can be flagged as unencodable and a suitable code transmitted indicating "unencodeable".

One or more embodiments of the encoders and/or decoders described or herein or encompassed hereby can be implemented using a processor or controller as such terms are expansively explained and elucidated earlier.

It should be understood that one or more features from one or more of the representative and non-exhaustive embodiments described herein can be combined. For example, in one example variation a encoder can include both the fraction checker unit 30 of the embodiment of FIG. 2 with the T(N,K) look up table 40 of the embodiment of FIG. 4. As another example, any of the embodiments can include a encoder technique selector 70 such as that of the embodiment of FIG. 8.

This technology is particularly useful for encoding acknowledgement words in packet data communications systems so that less than one bit per packet is required to indicate success of failure of the packet, and may be used where run-length encoding is not suitable. In general, the technology comprises a method of encoding an N-bit binary pattern into less than N bits when is known to contain a preponderance of one bit polarity over the other. Assuming a first polarity bit (such as binary is) occur with the lesser frequency, a base index To is computed based on the actual number K of first polarity bits, the index being equal to $^NC_1 + ^NC_2 + ^NC_3 \ldots + ^NC_{K-1}$. Then an index I is computed to represent a particular pattern of exactly K 1's in N bits, and added to the base index to obtain the encoded representation M=Io+I.

For decoding M to obtain the original N-bit word, M is compared successively with $^NC_1, ^NC_2, ^NC_3 \ldots, ^NC_{K-1}$, subtracting the comparison value from M if it is less than M. The residual value of M equals I, and the number of errors K is given by one plus the suffix of the last permutation number to be subtracted. The value of I, given K, can then be decoded to reproduce the original N bits.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

```
C*******TEST PROGRAM FOR CODING AND DECODNG********
        INTEGER*4 N,K,NCK(24,12),ACK,NAK,M
        COMMON NCK
CCONSTRUCT TABLE OF COMBINATORIAL VALUES****
        DO 1 I=1,24
        NCK(I,1)=I
        IF(I.LE.12)NCK(I,I)=1
1       CONTINUE
        DO 2 N=3,24
        KMAX=N-1
        IF(KMAX.GT.12)KMAX=12
        DO 2 K=2,KMAX
        NCK(N,K)=NCK(N-1,K-1)+NCK(N-1,K)
    2   CONTINUE
C**INPUT A TEST VALUE AND THE NUMBER O 1'S IT
CONTAINS******
    99  READ(*,*)ACK,K
        IF(K.GT.12)GO TO 99
        IF(K.LT.0)STOP
C       KK=ICODE(24,K,ACK)
        KK=M(24,24,K,ACK)
        WRITE(*,*)KK
        ACK=NAK(24,KK)
        WRITE(*,*)ACK
        GO TO 99
        END
C****************************************************
```

TABLE 2

```
C******THE RECURSIVE ENCODING FUNCTION**************
        RECURSIVE INTEGER FUNCTION M(NN,N,K,ACK)
        INTEGER*4 N,K,ACK,NCK(24,12)
        COMMON NCK
        M=0
        IF(K.GT.0)THEN
        IF(BTEST(ACK,N-1))THEN
        IF(K.EQ.1)THEN
        M=N
        RETURN
        ENDIF
        M=NCK(NN,K-1)+NCK(N-1,K)+M(NN,N-1,K-1,ACK)
        ELSE
        M=M(NN,N-1,K,ACK)
        ENDIF
        ENDIF
        RETURN
        END
C****************************************************
```

TABLE 3

```
C**********THE DECODING FUNCTION*********************
        INTEGER FUNCTION NAK(NN,M)
        INTEGER*4 N,K,NCK(24,12),M,NN
        COMMON NCK
        NAK=0
        IF(M.LT.0)RETURN
        N=NN
        IF(M.EQ. 0)THEN
        NAK=16777215
        RETURN
        ENDIF
C****************************************************
```

TABLE 3-continued

```
        DO 1 K=1,12
        IF(M.LE.NCK(N,K))GO TO 99
        M=M-NCK(N,K)
    1   CONTINUE
        NAK=0
        RETURN
C AT THIS POINT WE KNOW THERE ARE K ERRORS
   99   IF(K.LE.0)RETURN
        IF(N.LE.K)THEN
        NAK=NAK+2**N-1
        RETURN
        ENDIF
        IF(M.LE.NCK(N-1,K))THEN
        NAK=IBCLR(NAK,N-1)
        ELSE
        NAK=IBSET(NAK,N-1)
        M=M-NCK(N-1,K)
        K= K-1
        ENDIF
        N=N-1
        GO TO 99
        END
```

What is claimed is:

1. An encoder configured to assign a code of less than N number of bits in length to a pattern of bits of a first value distributed within a block of N binary bits, the encoder comprising:
   a base selection unit configured to select a base value dependent on a number of bits of the first value in the block of N binary bits;
   a displacement value determination unit configured to determine a displacement value representative of a particular distribution of the number of bits of the first value in the block of N binary bits; and
   an adder configured to add the base value and the displacement value to obtain a sum.

2. The encoder of claim 1, wherein the base selection unit is configured to evaluate an Expression $Io = {}^NC_1 + {}^NC_2 + {}^NC_3 \ldots + {}^NC_{K-1}$, wherein K is the determined number of bits of the first value in the block of N binary bits, wherein N, K, and ${}^NC_K$ are integers, ${}^NC_K$ being notation for a number of ways to choose K things from a total of N.

3. The encoder of claim 1, wherein the displacement value determination unit is configured, if bit N is a binary first value bit, to recursively determine the displacement value I(N,K) as ${}^{N-1}C_K + I(N-1, K-1)$, where $I(N-1, K-1)$ is the encoding of the pattern of K-1 number of remaining first value bits in N-1 bits, but if bit N is not a first value bit, to recursively determine the displacement value I(N,K) as I(N-1,K) where K is the encoding of the pattern of K number of first value bits in the remaining N-1 number of bits, wherein N, K, I, and ${}^NC_K$ are integers, ${}^NC_K$ being notation for a number of ways to choose K things from a total of N.

4. The encoder of claim 1, further comprising a encoder technique selector configured to select an order of invocation of plural possible encoding techniques, at least one of the encoding techniques being implemented using the base selection unit and the displacement value determination unit.

5. The encoder of claim 4, further comprising a encoding technique selection indicator configured to include with the assigned code an indication as to which of the plural possible encoding techniques was actually utilized for the word.

6. A method for assigning a code of less than N number of bits in length to a pattern of bits of a first value distributed within a block of N binary bits (N being an integer), the method comprising:

(1) determining a number of bits of the first value in the block of N binary bits;
(2) selecting a base value based on the determined number of bits of the first value;
(3) determining a displacement value representative of a particular distribution of the determined number of bits of the first value in the block of N binary bits; and
(4) adding the base value and the displacement value to obtain a sum and using the sum to form an assigned code.

7. The method of claim 6, wherein the first value is a binary one.

8. The method of claim 6, further comprising using each bit of the block of N binary bits for designating whether an error has been detected a packet of the block corresponding to the bit.

9. The method of claim 6, further comprising using the sum as the assigned code.

10. The method of claim 6, wherein the act (2) of selecting the base value comprises evaluating an Expression $Io = {}^NC_1 + {}^NC_2 + {}^NC_3 \ldots + {}^NC_{K-1}$, wherein K is the determined number of bits of the first value in the block of N binary bits, wherein K and ${}^NC_K$ are integers, ${}^NC_K$ being notation for a number of ways to choose K things from a total of N.

11. The method of claim 6, wherein the act (3) of determining the displacement value comprises:
   initializing the displacement value to zero;
   returning a displacement value of zero if a number of bits of the first value remaining in the bit block is zero;
   if a number of bits of the first value in the bit block is non-zero and if a first bit of the block of bits is a bit of the first value, the performing the acts of:
      adding ${}^NC_K$ to the displacement value, where K is the determined number of bits of the first value in the N-bit block;
      adding the displacement value determined in a like manner to represent the pattern of K-1 remaining first values bits in the N-1 remaining bits;
   if the first bit of the block of bits is not the first value, adding to the displacement value the displacement value determined in a like manner for the pattern of K number of first value bits located in the remaining N-1 bits.

12. The method of claim 6, wherein the act (3) of determining the displacement value comprises:
   if bit N is a binary first value bit, recursively determining the displacement value I(N,K) as ${}^{N-1}C_K + I(N-1, K-1)$, where $I(N-1, K-1)$ is the encoding of the pattern of K-1 number of remaining first value bits in N-1 bits;
   if bit N is not a first value bit, recursively determining the displacement value I(N,K) as I(N-1,K) where K is the encoding of the pattern of K number of first value bits in the remaining N-1 number of bits.

13. The method of claim 6, further including determining if the assigned code is greater than a maximum allowed value, and if so, setting the assigned code to the maximum allowed value.

14. The method of claim 6, further including:
   prior to act (1), using run-length encoding to encode the block of N-bits; and, if using the run-length encoding does not produce an encoded block of bits shorter than a desired length,
   performing acts (2)-(4) to obtain the assigned code.

15. The method of claim 14, further comprising appending an indicator to the encoded block to indicate whether or not run length encoding was used to encode the block of N bits.

16. The method of claim 6, wherein if the assigned code obtained from acts (1)-(4) is greater or equal to a maximum allowed value, using run-length encoding to encode said N-bit block to produce an encoded block; and optionally, if said encoded block is greater than a maximum allowed length in bits, setting the assigned code to said maximum allowed value;

if said encoded block is not greater than a maximum allowed length in bits, using said run-length encoded block as the assigned code.

17. The method of claim 16, further comprising appending the indicator to indicate whether or not run length encoding was used to produce the assigned code.

18. The method of claim 6, further including:

prior to act (1), determining whether bits of a first polarity in said N-bit block are all located in one of a number of particular subsets of said N-bits, and if not, performing acts (1) through (4).

19. The method of claim 18, wherein, if the bits of the first polarity in the N-bit blocks are all located in a particular subset of said N-bits, using as the assigned code said subset of bits appended to an indicator indicating which subset was used and that a subset was used.

20. A decoder configured to decode an assigned code of less than N number of bits in length to obtain a pattern of K number of bits of a first value distributed within a block of N binary bits, the decoder being configured to perform the acts of:

(1) successively comparing a received code M=Io+I to comparison values, $^{N}C_1, ^{N}C_2 \ldots ^{N}C_{Kmax}$;

(2) using a comparison result of act (2) for determining the K number of the first value bits in the N-bit word to be reconstructed; and, (3) using a residual value of M from the comparison result of act (2) for determining a displacement value (I) which was assigned to a particular pattern of exactly K number of the first value bits.

21. The apparatus of claim 20, wherein the decoder is further configured to perform the following recursive acts if displacement value (I) it is less or equal to $^{N-1}C_K$:

if bit(N) does have the first value, subtracting the comparison value and comparing the remainder with $^{N-2}C_{K-1}$ to determine bit(N-1); and if bit(N) is not the first value bit, then comparing with $^{N-1}C_{K-1}$.

22. A method of decoding an assigned code of less than N number of bits in length to obtain a pattern of K number of bits of a first value distributed within a block of N binary bits, the method comprising:

(1) successively comparing a received code M=Io+I to comparison values, $^{N}C_1, ^{N}C_2 \ldots ^{N}C_{Kmax}$;

(2) using a comparison result of act (2) for determining the K number of the first value bits in the N-bit word to be reconstructed; and, (3) using a residual value of M from the comparison result of act (2) for determining a displacement value (I) which was assigned to a particular pattern of exactly K number of the first value bits, N, M, K, and I being integers.

23. The method of claim 22, further comprising the following recursive acts if displacement value (I) it is less or equal to $^{N-1}C_K$ ($^{N-1}C_K$ being an integer and $^{N}C_K$ being notation for a number of ways to choose K things from a total of N):

if bit(N) does have the first value, subtracting the comparison value and comparing the remainder with $^{N-2}C_{K-1}$ to determine bit(N-1); and if bit(N) is not the first value bit, then comparing with $^{N-1}C_{K-1}$.

* * * * *

UNITED STATES PATENT AND TRADEMARK OFFICE
CERTIFICATE OF CORRECTION

PATENT NO. : 7,511,640 B2  
APPLICATION NO. : 11/669252  
DATED : March 31, 2009  
INVENTOR(S) : Dent Page 1 of 1

It is certified that error appears in the above-identified patent and that said Letters Patent is hereby corrected as shown below:

In Column 11, Line 36, delete "is)" and insert -- 1s) --, therefor.

In Column 11, Line 37, delete "To" and insert -- Io --, therefor.

Signed and Sealed this

Twentieth Day of October, 2009

David J. Kappos
*Director of the United States Patent and Trademark Office*